(12) United States Patent
Iwashita et al.

(10) Patent No.: US 8,278,849 B2
(45) Date of Patent: Oct. 2, 2012

(54) CONTROLLER FOR CALCULATING ELECTRIC POWER CONSUMPTION OF INDUSTRIAL MACHINE

(75) Inventors: Yasusuke Iwashita, Yamanashi (JP); Tadashi Okita, Yamanashi (JP); Hiroyuki Kawamura, Yamanashi (JP); Junichi Tezuka, Yamanashi (JP); Kenta Yamamoto, Yamanashi (JP)

(73) Assignee: Fanuc Ltd, Yamanashi (JP)

( * ) Notice: Subject to any disclaimer, the term of this patent is extended or adjusted under 35 U.S.C. 154(b) by 445 days.

(21) Appl. No.: 12/610,122

(22) Filed: Oct. 30, 2009

(65) Prior Publication Data

US 2010/0117568 A1    May 13, 2010

(30) Foreign Application Priority Data

Nov. 7, 2008  (JP) ................................ 2008-287081

(51) Int. Cl.
*H02P 21/00*       (2006.01)
(52) U.S. Cl. ............... 318/400.02; 318/400.07; 318/490
(58) Field of Classification Search ............. 318/400.02, 318/400.07, 490, 433, 459, 375, 400.42, 318/400.11, 368, 400.04, 400.21, 400.23; 381/455
See application file for complete search history.

(56) References Cited

U.S. PATENT DOCUMENTS

2009/0171554 A1 *  7/2009  Yaguchi ........................ 701/112

FOREIGN PATENT DOCUMENTS

| | | |
|---|---|---|
| EP | 0 579 513 B1 | 6/1996 |
| JP | 06-038575 A | 2/1994 |
| JP | 2000-206150 A | 7/2000 |
| JP | 2001086797 | 3/2001 |
| JP | 2002165478 | 6/2002 |
| JP | 2002247896 | 8/2002 |
| JP | 2004032848 | 1/2004 |
| JP | 2006217762 | 8/2006 |
| JP | 2007202287 | 8/2007 |
| JP | 2008253098 | 10/2008 |

OTHER PUBLICATIONS

Notice of Reasons for Rejection for JP 2008-287081 issued Apr. 20, 2010.

* cited by examiner

*Primary Examiner* — Karen Masih
(74) *Attorney, Agent, or Firm* — Lowe Hauptman Ham & Berner LLP

(57) ABSTRACT

A controller of an industrial machine provided with an electric motor, a peripheral apparatus and an amplifier includes a motor power-consumption calculation section, a power loss calculation section, a fixed power-consumption calculation section, and a total power-consumption calculation section. The motor power-consumption calculation section calculates motor power consumption by decomposing a motor current into a Q-phase current value and a D-phase current value, and multiplying the Q-phase current value with a motor rotation speed and a motor torque constant. The power loss calculation section calculates sum power loss of the motor and amplifier. The fixed power-consumption calculation section calculates fixed power consumption of the peripheral apparatus. The total power-consumption calculation section determines total power consumption of the industrial machine in a predetermined time period by integrating, for the time period, the calculated motor power consumption, sum power loss and fixed power consumption.

8 Claims, 3 Drawing Sheets

CONTROLLER FOR CALCULATING ELECTRIC POWER CONSUMPTION OF INDUSTRIAL MACHINE

RELATED APPLICATIONS

The present application is based on, and claims priority from, Japanese Application Number 2008-287081, filed Nov. 7, 2008, the disclosure of which is hereby incorporated by reference herein in its entirety.

BACKGROUND OF THE INVENTION

1. Field of the Invention

The present invention relates to a controller for an industrial machine provided with an electric motor, such as a machine tool, a robot, etc.

2. Description of the Related Art

In a system including an industrial machine, such as a machine tool or a robot, provided with a mechanical part driven by an electric motor using electric power, information on the electric power consumption of the industrial machine is often required for various purposes. The information on the electric power consumption can be obtained by a wattmeter attached to an electric power source of the industrial machine.

Japanese Unexamined Patent Publication (Kokai) No. 2000-206150 (JP2000-206150A) describes a configuration in which a controller of an industrial machine determines electric power consumption by calculation. In this configuration, the controller determines the electric power consumption of an electric motor based on a feedback signal of a motor current detection value that is in turn used for controlling the electric motor in order to operate the mechanical part of the industrial machine to perform a desired motion. Further, since a power consuming component other than the electric motor (i.e., a peripheral apparatus), such as a heater provided in the industrial machine, consumes constant electric power during the operation thereof, the controller also determines the electric power consumption of the peripheral apparatus by using data of the operating time thereof, which can be obtained in the controller. Thus, the information on the electric power consumption for each of the various power consuming components is determined by calculation, so as to be usable for analysis for, e.g., the effective utilization of electric power.

Thus, information on the electric power consumption of the industrial machine may generally be obtained by using a wattmeter, while the controller of the industrial machine can calculate electric power consumption based on data used for performing an operational control. The configuration wherein the controller calculates the electric power consumption by using the data for operational control is rational, and thus can eliminate the need of a dedicated device, such as a wattmeter, and reduce cost. Further, the configuration wherein the controller determines the electric power consumption, makes it possible to perform electricity consumption analysis based on the electric power consumption of each of a plurality of electric motors.

SUMMARY OF THE INVENTION

It is an object of the present invention to provide a controller of an industrial machine provided with a mechanical part driven by an electric motor, which can accurately calculate electric power consumption.

One aspect of the present invention provides a controller of an industrial machine provided with an electric motor, a peripheral apparatus and an amplifier driving the electric motor, comprising a motor power-consumption calculation section calculating motor power consumption of the electric motor by multiplying a motor current detection value, a motor rotation-speed detection value and a predetermined motor torque constant together; a power loss calculation section calculating sum power loss of the electric motor and the amplifier by adding motor power loss determined by multiplying a square of the motor current detection value by a predetermined motor winding-resistance value, amplifier power loss determined by multiplying the motor current detection value by a predetermined amplifier power-loss coefficient, and predetermined fixed amplifier power consumption together; a fixed power-consumption calculation section calculating fixed power consumption of the peripheral apparatus; and a total power-consumption calculation section determining total power consumption of the industrial machine in a predetermined time period by integrating, for the predetermined time period, the motor power consumption calculated by the motor power-consumption calculation section, the sum power loss calculated by the power loss calculation section, and the fixed power consumption calculated by the fixed power-consumption calculation section.

According to the above configuration, the controller can calculate the total power consumption of the industrial machine based on the data used for performing the operational control. In particular, by considering the loss in the electric motor and the amplifier as well as the fixed power consumption of the peripheral apparatus, the electric power consumption can be accurately calculated, without using a dedicated device, such as a wattmeter.

Another aspect of the present invention provides an industrial machine, comprising an electric motor; a current detection unit detecting an electric current flowing through the electric motor; a rotation speed detection unit detecting a rotation speed of the electric motor; an amplifier driving the electric motor; a peripheral apparatus; and a controller controlling operations of the electric motor and the peripheral apparatus; the controller comprising a motor power-consumption calculation section calculating motor power consumption of the electric motor by multiplying a motor current detection value detected by the current detection unit, a motor rotation-speed detection value detected by the rotation speed detection unit, and a predetermined motor torque constant together; a power loss calculation section calculating sum power loss of the electric motor and the amplifier by adding motor power loss determined by multiplying a square of the motor current detection value by a predetermined motor winding-resistance value, amplifier power loss determined by multiplying the motor current detection value by a predetermined amplifier power-loss coefficient, and predetermined fixed amplifier power consumption together; a fixed power-consumption calculation section calculating fixed power consumption of the peripheral apparatus; and a total power-consumption calculation section determining total power consumption of the industrial machine in a predetermined time period by integrating, for the predetermined time period, the motor power consumption calculated by the motor power-consumption calculation section, the sum power loss calculated by the power loss calculation section, and the fixed power consumption calculated by the fixed power-consumption calculation section.

BRIEF DESCRIPTION OF THE DRAWINGS

The above and other objects, features and advantages of the present invention will become more apparent from the following description of the preferred embodiments in connection with the accompanying drawings, wherein.

DETAILED DESCRIPTION

Figure 1:
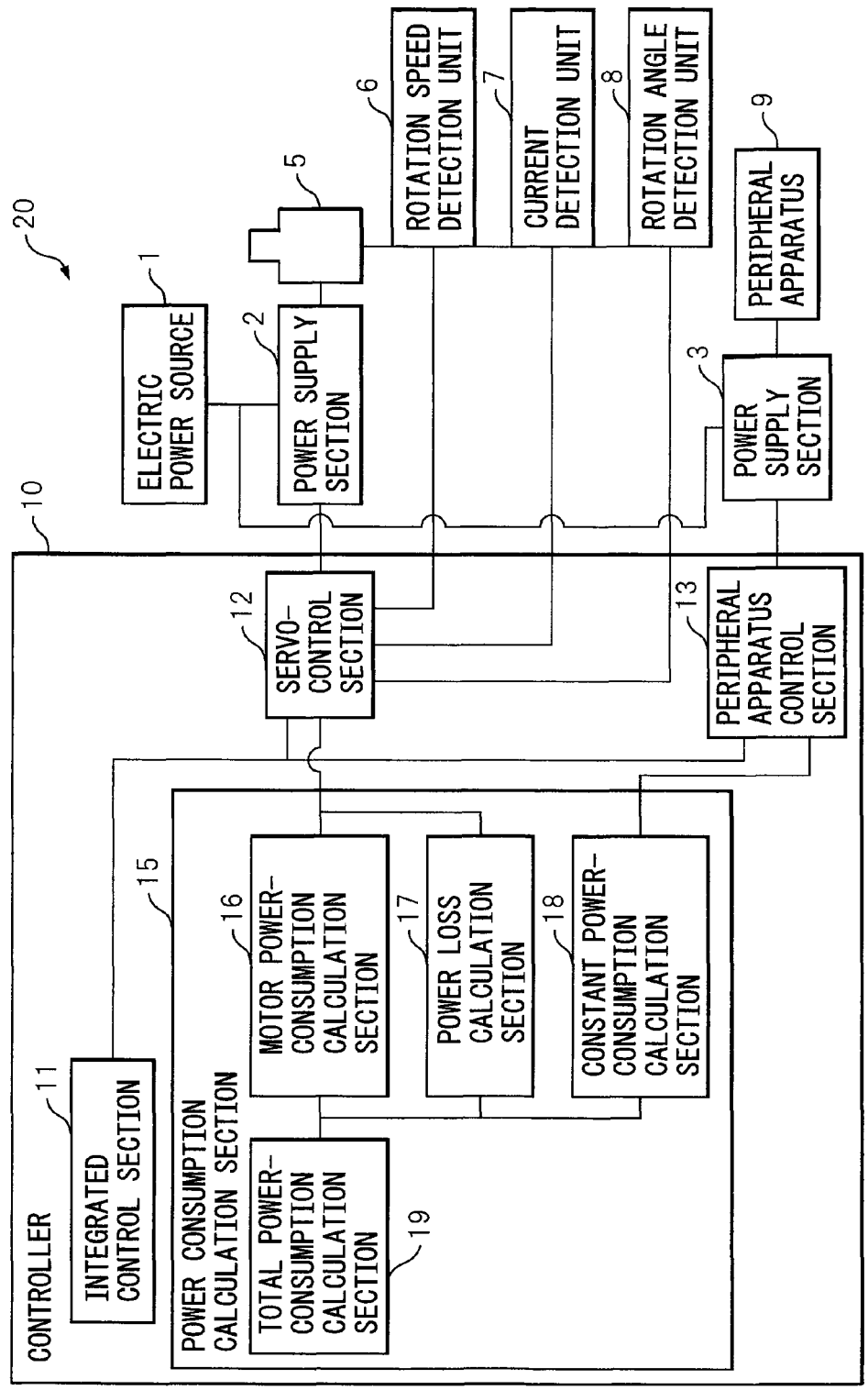
FIG. 1 is a block diagram showing a configuration of an industrial machine including a controller according to an embodiment of the present invention.

The embodiments of the present invention are described below, in detail, with reference to the accompanying drawings. In the drawings, same or similar components are denoted by common reference numerals.

Referring to the drawings, FIG. 1 shows a configuration of an industrial machine 20 including a controller 10 according to an embodiment of the present invention. The illustrated industrial machine 20 includes an electric motor 5 as a synchronous motor (hereinafter referred simply to as the motor 5); a peripheral apparatus 9 as a power consuming component other than the motor 5, which operates while consuming substantially constant electric power per unit time; and the controller 10 controlling the operations of the motor 5 and the peripheral apparatus 9. The motor 5 and the peripheral apparatus 9 are connected to an electric power source 1 through power supply sections 2 and 3. The power supply sections 2 and 3 are connected to a servo control section 12 and a peripheral apparatus control section 13, respectively. The servo control section 12 and the peripheral apparatus control section 13 are connected to an integrated control section 11 for regulating the operation of the entire industrial machine.

The illustrated industrial machine 20 is equipped with the single motor 5 and the single peripheral apparatus 9, but may be equipped with a plurality of motors 5 and/or a plurality of peripheral apparatus 9. Corresponding thereto, the industrial machine 20 may be equipped with a plurality of servo control sections 12, a plurality of peripheral apparatus control sections 13, and/or a plurality of power supply sections 2, 3. Further, the industrial machine 20 may be equipped with a plurality of electric power sources 1 in total, each of which is provided for the desired number of power supply sections 2, 3.

The illustrated controller 10 is provided with a plurality of functional blocks representing a plurality of sections such as the integrated control section 11. The functional blocks may be configured by a plurality of separate hardware, or alternatively, configured by a plurality of software in a single hardware possessing a function not clearly sectionalized into a plurality of functional blocks. In the case of the configuration as the software, the functional blocks may be configured of a plurality of software elements, or alternatively, configured of a single software possessing function not clearly sectionalized into a plurality of functional blocks.

In the illustrated industrial machine 20, the integrated control section 11 properly outputs commands for operating a mechanical part (not shown) driven by the motor 5 and/or the peripheral apparatus 9 correspondingly to a task, such as a manufacturing process, performed by the industrial machine 20, to the servo control section 12 and the peripheral apparatus control section 13. In response to the commands from the integrated control section 11, the servo control section 12 and the peripheral apparatus control section 13 output control signals to the power supply sections 2, 3, so as to control electric power supplied to the motor 5 and the peripheral apparatus 9 and thus to control the operations thereof.

The power supply section 2 connected to the motor 5 is embodied as an amplifier functioning to change the frequency and/or current of the electric power supplied to the motor 5 in response to the commands from the servo control section 12. The servo control section 12 functions to properly control the amount of rotation (or a position), the speed and/or the torque of the motor 5 as occasion demands, and thus control the operation of the power supply section (or amplifier) 2 so as to obtain appropriate speed and/or torque. In order to perform such operational control, the servo control section 12 is connected to a rotation speed detection unit 6, a current detection unit 7 and a rotation angle detection unit 8, that are equipped in association with the motor 5, and uses signals received from these devices 6-8 as feedback signals.

The peripheral apparatus 9 is embodied as, e.g., a heater, and the peripheral apparatus control section 13 may be configured to switch the electric power supply of the power supply section 3 between on and off. Alternatively, the peripheral apparatus control section 13 may be configured to switch the electric power supply from the power supply section 3 to the peripheral apparatus 9 between a plurality of levels, such as high and low levels. The peripheral apparatus 9 may be configured to continuously operate during a time when a main power source of the industrial machine 20 is turned on, and in this configuration, the power supply section 3 and/or the peripheral apparatus control section 13 may be omitted. It should be noted that, in the illustrated embodiment, the electric power supply to the controller 10 is included in the electric power supply to the peripheral apparatus 9.

In the illustrated embodiment, the controller 10 includes a power consumption calculation section 15 calculating the overall electric power consumption of the industrial machine 20 based on data obtained in the controller 10, without requiring a dedicated device, such as a wattmeter. The power consumption calculation section 15 includes a motor power-consumption calculation section 16 and a power loss calculation section 17, that are connected to the servo control section 12, and a fixed power-consumption calculation section 18 connected to the peripheral apparatus control section 13. The motor power-consumption calculation section 16 calculates the electric power consumption of the motor 5 by using data provided in the servo control section 12, and the power loss calculation section 17 calculates electric power loss in the motor 5 and the power supply section (or amplifier) 2, resulting when the motor 5 operates, by using data provided in the servo control section 12. The fixed power-consumption calculation section 18 calculates the electric power consumption of the peripheral apparatus 9 (including the electric power consumption of the controller 10) by using data provided in the peripheral apparatus control section 13. The power consumption calculation section 15 also includes a total power-consumption calculation section 19 connected to the motor power-consumption calculation section 16, the power loss calculation section 17 and the fixed power-consumption calculation section 18. The total power-consumption calculation section 19 calculates the total power consumption of the industrial machine 20.

Figure 2:
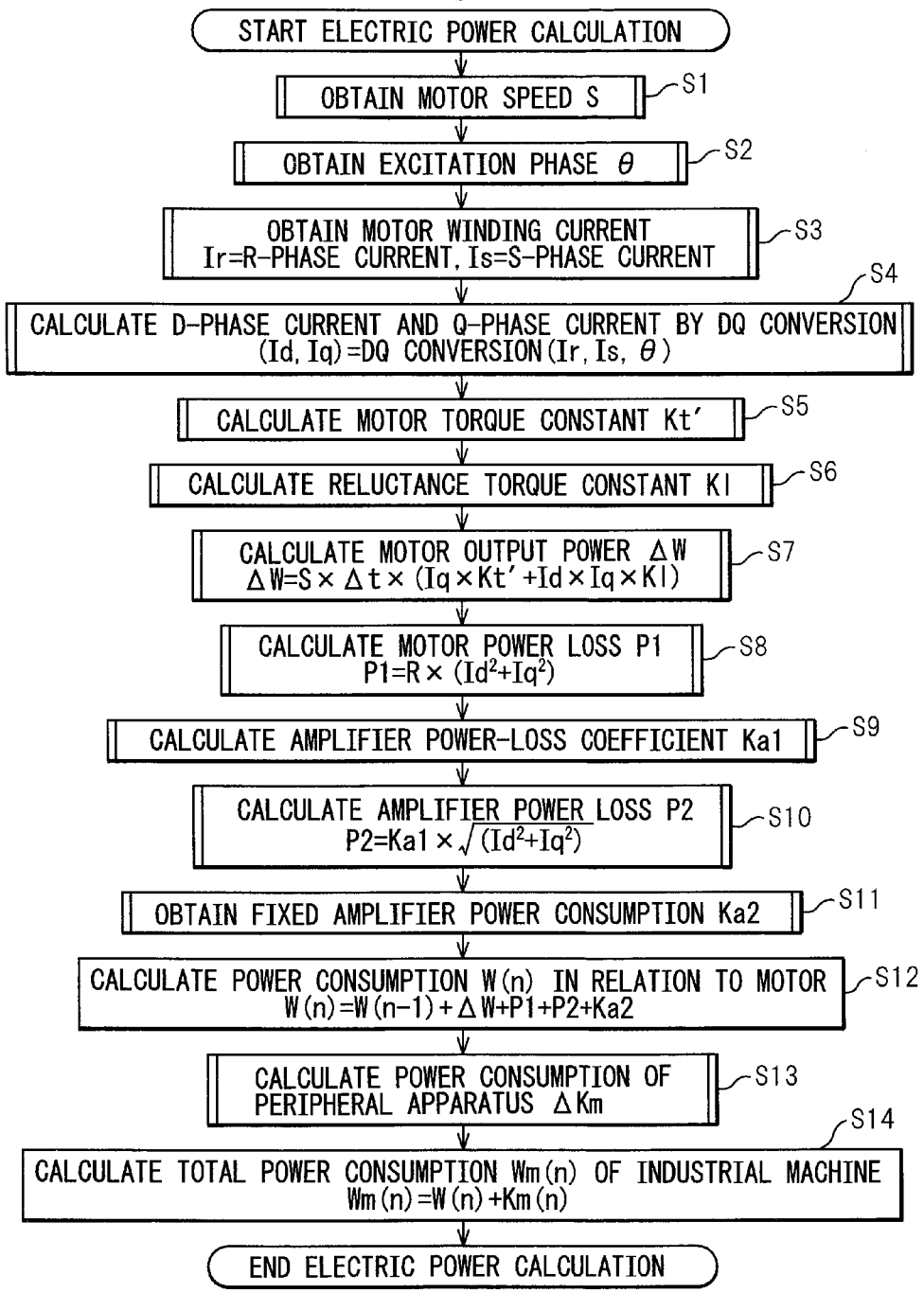
FIG. 2 is a flow chart showing a calculation of electric power consumption executed by the controller of FIG. 1.

A process for calculating the electric power consumption executed in the power consumption calculation section 15 will be described below with reference to FIG. 2. In the illustrated embodiment, the power consumption calculation section 15 samples data at every predetermined cycles $\Delta t$ to determine the electric power consumption at each cycle, and accumulates or integrates the electric power consumption determined at each cycle for a predetermined time period, so as to determine the electric power consumption accumulated in the predetermined time period. FIG. 2 is a flow chart showing the process for calculating the electric power consumption in a single sampling cycle.

First, in steps S1, S2 and S3, a motor rotation speed S, an excitation phase θ and motor winding currents Ir and Is, are obtained, respectively. These data are obtained by the motor power-consumption calculation section 16 (FIG. 1), based on signals detected by the rotation speed detection unit 6, the current detection unit 7 and the rotation angle detection unit 8, equipped in association with the motor 5, and input to the servo control section 12.

Next, in step S4, a D-phase current Id and a Q-phase current Iq are calculated, through a DQ coordinate conversion, based on the excitation phase θ and the motor winding currents Ir, Is, obtained respectively in steps S2 and S3.

A principle of the DQ coordinate conversion is described below. An α-β coordinate system as a Cartesian or rectangular coordinate system fixed on a stator (not shown) of the motor 5, and a d-q coordinate system as a Cartesian or rectangular coordinate system fixed on a rotor (not shown), are considered. The α-β coordinate system is a stationary coordinate system, while the d-q coordinate system is a coordinate system rotating together with the rotation of the rotor. The direction of a d-axis is defined to coincide with the direction of a rotor magnetic flux.

The winding current of the motor 5 is represented by a current component Iα in a α-axis direction and a current component Iβ in a β-axis direction, and the current components Iα and Iβ are decomposed into a component Id in a d-axis direction and a component Iq in a q-axis direction. In this connection, denoting the phase angle of the rotor with respect to the α-axis by φ, relational expressions are established as follows:

$$Id = \cos\phi \times I\alpha + \sin\phi \times I\beta$$

$$Iq = \sin\phi \times I\alpha + \cos\phi \times I\beta$$

According to the above expressions, the motor power-consumption calculation section 16 (FIG. 1) can obtain the D-phase current Id and the Q-phase current Iq, based on the excitation phase θ and the motor winding current Ir, Is.

Next, in step S5, a motor torque constant Kt' is calculated. In this connection, a motor output power P can be calculated by using the motor rotation speed S obtained in step S1 and the Q-phase current Iq calculated in step S4 as a current component orthogonal to the magnetic flux, as follows:

$$P(W) = \text{Q-phase current } Iq \text{ } (A) \times \text{constant } Kt' \text{ } (Nm/A) \times \text{motor rotation speed } S \text{ } (rad/s)$$

The above constant Kt' is defined as a motor torque constant, in the present application. In this connection, in a range where the amplitude of the Q-phase current Iq is sufficiently small, the output torque T of the motor 5 is generally proportional to the Q-phase current Iq, and therefore, the motor torque constant Kt' can be treated as a constant or inalterable value Kt determined depending on the strength of the magnetic flux of the motor 5. Thus, in this range, T=Kt×Iq.

Figure 3A:
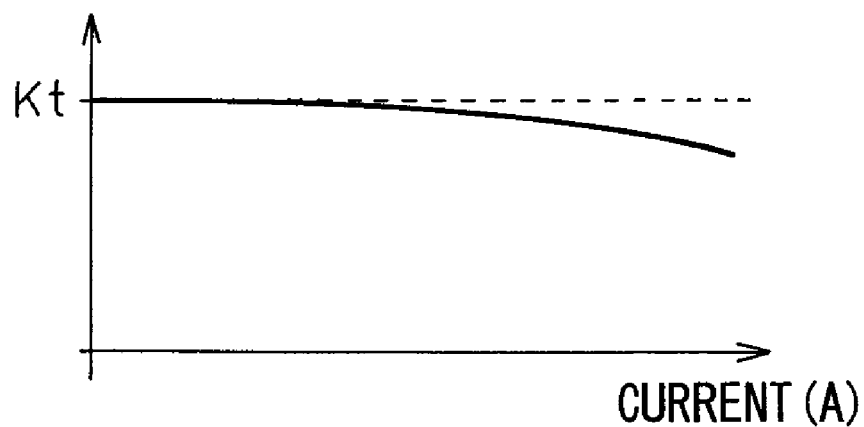
FIG. 3A is an illustration graphically showing an example of alteration of a motor torque constant with respect to a motor winding current.

However, the actual motor torque constant Kt' is not inalterable, and tends to decrease as the amplitude of the Q-phase current Iq increases, as shown in FIG. 3A. Therefore, in step S5, the motor power-consumption calculation section 16 (FIG. 1) calculates the motor torque constant Kt' depending on the Q-phase current Iq calculated in Step S4.

Figure 3B:
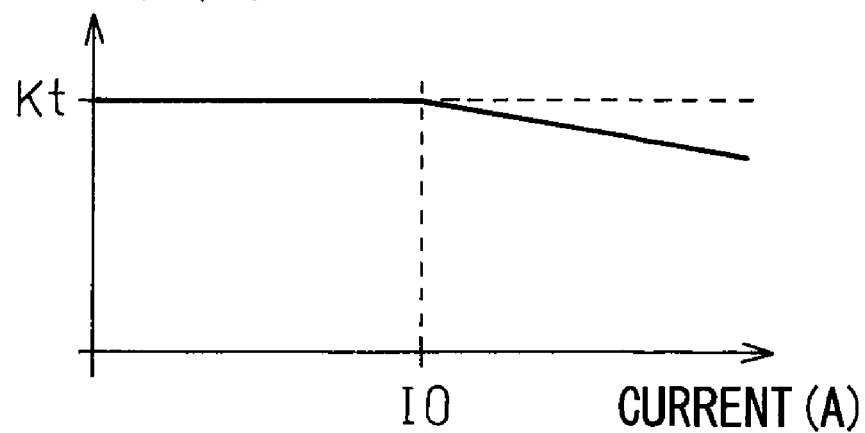
FIG. 3B is an illustration graphically showing an example of two straight lines approximating the curve of FIG. 3A.

In order to calculate the motor torque constant Kt', the relationship between the motor torque constant Kt' of the motor 5 and the current, as shown in FIG. 3A, is previously determined. The relationship may be determined through a test, or alternatively, may be estimated theoretically from the specifications of the motor 5. Then, the relationship (represented by a curve) between the motor torque constant and the current, as shown in FIG. 3A, is approximated by, e.g., two straight lines, as shown in FIG. 3B, so that the motor torque constant Kt' can be calculated. In the example shown in FIG. 3B, the motor torque constant Kt' is calculated in such a manner that, when Iq is equal to or less than I0, it is assumed that Kt'=kt, and when Iq is larger than I0, it is assumed that Kt'=Kt−(Iq−I0)×a. In order to perform such calculation, the values of I0 and "a" (slope) are previously stored in a storage section (not shown) of the controller 10.

Alternatively, the relationship between the current and the motor torque constant may be stored in the form of a table. In this case, the motor torque constant Kt' can be calculated through, e.g., interpolation, based on the data stored in the table depending on the value of Iq.

Next, in step S6, a reluctance torque constant Kl is obtained. In this connection, the D-phase current Id calculated in step S4 is essentially a reactive current that does not contribute to the generation of torque of the motor 5. However, if the inductances of every magnetic poles in the motor 5 are not uniform, torque is generated due to the flow of the D-phase current Id. This torque is called a reluctance torque, and denoting the inductances of the motor 5 in a d-axis direction and a q-axis direction by Ld and Lq, respectively, the reluctance torque can be calculated by the following theoretical equation:

$$\text{Reluctance torque} = (Ld-Lq) \times Id \times Iq$$

From the above equation, it will be understood that the reluctance torque increases as the fluctuation of the inductance of each magnetic pole increases, and also as the D-phase current Id (or the reactive current) increases. Therefore, in an electric motor configured in such a manner that the electromotive force of motor windings is high and reactive current flows when the motor rotates at high speed so as to reduce a terminal voltage of the motor, the reluctance torque becomes large and thus cannot be ignored.

Thus, in order to determine the reluctance torque as described above, the reluctance torque constant Kl is previously obtained. The reluctance torque constant Kl corresponds to the term (Ld−Lq) in the above theoretical equation, and may be determined through a test, or alternatively, may be estimated theoretically from the specifications of the motor 5. The previously-determined reluctance torque constant Kl is stored in the storage section of the controller 10, and in step S6, the motor power-consumption calculation section 16 (FIG. 1) reads and obtains the stored reluctance torque constant Kl.

Next, in step S7, using the data obtained in steps S1-S6, a motor output power ΔW at a sampling cycle Δt in which the present calculation flow is executed (hereinafter referred to as a present sampling cycle Δt), is calculated as follows:

$$\Delta W = S \times \Delta t \times (Iq \times Kt' + Id \times Iq \times Kl)$$

The motor output power ΔW is calculated by the motor power-consumption calculation section 16 (FIG. 1), and is treated as a motor power consumption at the present sampling cycle Δt.

Next, in step S8, a motor power loss P1 at the present sampling cycle Δt is calculated. In this connection, the motor power loss P1 in the motor 5 results depending on the motor winding current (i.e., D-phase current Id and Q-phase current Iq), i.e., P1=motor winding resistance R × (Id$^2$+Iq$^2$). The motor power loss P1 influences the electric power consumption of the industrial machine 20, and therefore, is calculated by the power loss calculation section 17 (FIG. 1) in step S8.

Next, in step S9, an amplifier power-loss coefficient Ka1 is calculated. In this connection, an amplifier power loss P2 in the power supply section (or amplifier) 2 results due to the switching of an IGBT (insulated gate bipolar transistor) as a power device (i.e., a power semiconductor device). The amplifier power loss P2 is proportional to the motor winding current, and determined by the following equation:

$$P2 = Ka1 \times \sqrt{(Id^2 + Iq^2)}$$

In this connection, in a PWM (pulse width modulation) control by the switching of the power device, when the switching frequency or PWM frequency of the power device increases, the amplifier power-loss coefficient Ka1 tends to increase. Such relationship is previously examined, and is previously stored in the form of an approximated function or a table. Then, the power loss calculation section 17 (FIG. 1) calculates the amplifier power-loss coefficient Ka1 depending on the actual PWM frequency in the power supply section (or amplifier) 2. As a result, the amplifier power loss P2 can be calculated accurately.

Next, in step S10, the power loss calculation section 17 (FIG. 1) calculates the amplifier power loss P2 at the present sampling cycle Δt, based on the amplifier power-loss coefficient Ka1 calculated in step S9 and the motor winding current (D-phase current Id and Q-phase current Iq) calculated in step S4.

Next, in step S11, fixed amplifier power consumption Ka2 at the present sampling cycle Δt is obtained. In this connection, the power supply section (amplifier) 2 constantly consumes electric power, and thus, the electric power consumption thereof is previously determined through a test or theoretically, and stored in the storage section of controller 10. In step S11, the power loss calculation section 17 (FIG. 1) reads and obtains the fixed amplifier power consumption Ka2 stored in the storage section. In this connection, the power loss calculation section 17 can calculate the electric power loss (summation value) of the motor 5 and the power supply section (or amplifier) 2 driving the motor 5, by adding the motor power loss P1 (step S8), the amplifier power loss P2 (step S10) and the fixed amplifier power consumption Ka2 (step S11) together.

Next, in step S12, an electric power consumption W(n) (integrated value) in relation to motor 5 is calculated. In this step, the motor output power ΔW calculated in step S7 is considered as the electric power consumption of the motor 5 at the present sampling cycle Δt, and added to an electric power consumption W(n-1) (integrated value) determined at the last sampling cycle. Further, the motor power loss P1, the amplifier power loss P2 and the fixed amplifier power consumption Ka2, determined in steps S8, S10 and S11, respectively, are added to the electric power consumption W(n-1). The above calculation in step 12 can be executed by the total power-consumption calculation section 19 (FIG. 1).

Next, in step S13, an electric power consumption ΔKm of the peripheral apparatus 9 at the present sampling cycle Δt is calculated. In this step, data relating to the operating state of the peripheral apparatus 9 (e.g., the on/off or level of the electric power supply) is obtained from the peripheral apparatus control section 13, and the electric power consumption ΔKm of the peripheral apparatus 9 depending on the operating state is calculated. In the case where the industrial machine includes a plurality of peripheral apparatuses 9, such as a continuously operated peripheral apparatus, the electric power consumptions ΔKm of the respective peripheral apparatuses 9 are calculated and added together, so as to calculate the total electric power consumption ΔKm (summation value) of the peripheral apparatuses. The electric power consumption of the controller 10 at the present sampling cycle Δt is also added to the ΔKm.

The electric power consumption ΔKm of the peripheral apparatus 9 can be calculated based on a fixed value previously determined through a test or theoretically and stored in the storage section of the controller 10. In this connection, the electric power consumption of the controller 10 is not always constant, but most of the electric energy in the industrial machine 20 is typically consumed by the operation of the motor 5, so that the electric power consumption of the controller 10 affects little on the total power consumption of the industrial machine. Therefore, an average value can be used as the electric power consumption of the controller 10, and in this configuration, the total power consumption of the industrial machine 20 can be calculated in a necessary and sufficient accuracy. The electric power consumption of the peripheral apparatus can be calculated in fixed power-consumption calculation section 18. The calculation of the electric power consumption ΔKm of the peripheral apparatus 9 can be executed by the fixed power-consumption calculation section 18 (FIG. 1).

Next, in step S14, the total power consumption Wm(n) of the industrial machine 20 is calculated by adding the electric power consumption Km(n) (integrated value) of the peripheral apparatus 9 to the electric power consumption W(n) (integrated value) in relation to the motor 5 determined in step S12. In this step, the electric power consumption ΔKm of the peripheral apparatus 9 at the present sampling cycle Δt calculated in step S13 is added to the electric power consumption Km(n-1) (integrated value) determined at the last sampling cycle, so as to calculate the electric power consumption Km(n) (integrated value) of the peripheral apparatus 9, and the calculated electric power consumption Km(n) (integrated value) is added to the electric power consumption W(n) (integrated value) in relation to the motor 5. The above calculation in step 14 can be executed by the total power-consumption calculation section 19 (FIG. 1).

The above-described calculation flow at one sampling cycle Δt is repeatedly executed over a predetermined time period, so that the motor output powers ΔW, the motor power losses P1, the amplifier power losses P2 and the fixed amplifier power consumptions Ka2, determined at respective sampling cycles Δt, are integrated for the predetermined time period, so as to determine the electric power consumption W in relation to the motor 5 in the predetermined time period, and that the electric power consumptions ΔKm of the peripheral apparatus 9 determined at respective sampling cycles Δt are integrated for the predetermined time period, so as to determine the electric power consumption Km of the peripheral apparatus 9 in the predetermined time period. Thereafter, the electric power consumption W and the electric power consumption Km are added together, and thereby the total power consumption Wm of the industrial machine 20 in the predetermined time period is determined. The total power consumption Wm of the industrial machine 20 can be calculated in the total power-consumption calculation section 19 (FIG. 1).

According to the illustrated embodiment, in the industrial machine 20 provided with the mechanical part (not shown) driven by the motor 5, the controller 10 can accurately calculate the electric power consumption Wm based on the data used for performing the operation control, without using a dedicated device, such as a wattmeter. In particular, by considering the loss in the motor 5 and power supply section (or amplifier) 2 as well as the electric power consumption in the peripheral apparatus 9 and/or the controller 10, high calculation accuracy comparable with that measured by using the wattmeter can be obtained.

It should be noted that the above-described embodiment merely exemplifies the present invention, and various changes can be made within the scope of the present invention defined by the appended claims.

For example, in the illustrated embodiment, the motor power consumption ΔW is calculated by decomposing the motor current detection value into the Q-phase current value Iq and the D-phase current value Id, so as to take the D-phase current value Id into consideration and thus to improve the calculation accuracy. Further, in the illustrated embodiment, the motor power consumption ΔW is calculated by using the reluctance torque obtained by multiplying the Q-phase current value Iq, the D-phase current value Id and a predetermined constant K1, so as to take the reluctance torque into consideration and thus to improve the calculation accuracy. In this connection, in the conventional control of a synchronous motor, the motor is typically controlled so that D-phase current=0 (i.e., Q-phase current=motor winding current). When this conventional control is adopted, the DQ coordinate conversion in step S4 may be omitted, and the subsequent calculation may be performed using the motor winding current in place of the Q-phase current. Further, in this case, since the reluctance torque becomes zero, the calculation in step S6 may be omitted. Even when the D-phase current occurs, provided that the difference between inductances in the d-axis and q-axis directions is small and the reluctance torque is thus negligible, the calculation in step S6 may also be omitted.

Further, in the illustrated embodiment, the motor torque constant Kt' is provide as the alterable value altering depending on the motor winding current, so as to improve the calculation accuracy. In this connection, the alteration of the motor torque constant Kt' becomes remarkable in a range where the motor winding current is large. Therefore, in the case where the alteration of the motor torque constant Kt' is sufficiently small in a range of the motor winding current assumed in a normal operation, the motor torque constant may be treated as a constant or inalterable value Kt.

Also, in the illustrated embodiment, the amplifier power-loss coefficient Ka1 is provided as the alterable value altering depending on the PWM frequency, so as to improve the calculation accuracy. In this connection, the alteration of the amplifier power-loss coefficient Ka1 becomes remarkable in the case where the PWM frequency is large. Therefore, in the case where the alteration of the amplifier power-loss coefficient Ka1 is sufficiently small in a range of the PWM frequency in a normal operation, the amplifier power-loss coefficient Ka1 may be treated as a constant or inalterable value.

While the invention has been described with reference to specific preferred embodiments, it will be understood, by those skilled in the art, that various changes and modifications may be made thereto without departing from the scope of the following claims.

The invention claimed is:

1. A controller of an industrial machine provided with an electric motor, a peripheral apparatus and an amplifier driving the electric motor, comprising:
a motor power-consumption calculation section calculating motor power consumption of the electric motor by multiplying a motor current detection value, a motor rotation-speed detection value and a predetermined motor torque constant together;
a power loss calculation section calculating sum power loss of the electric motor and the amplifier by adding motor power loss determined by multiplying a square of the motor current detection value by a predetermined motor winding-resistance value, amplifier power loss determined by multiplying the motor current detection value by a predetermined amplifier power-loss coefficient, and predetermined fixed amplifier power consumption together;
a fixed power-consumption calculation section calculating fixed power consumption of the peripheral apparatus; and
a total power-consumption calculation section determining total power consumption of the industrial machine in a predetermined time period by integrating, for said predetermined time period, said motor power consumption calculated by said motor power-consumption calculation section, said sum power loss calculated by said power loss calculation section, and said fixed power consumption calculated by said fixed power-consumption calculation section,
wherein said motor power-consumption calculation section calculates said motor power consumption by decomposing the motor current detection value into a Q-phase current value in a direction of a q-axis orthogonal to a rotor magnetic flux and a D-phase current value in a direction of a d-axis coinciding with a direction of the rotor magnetic flux, and multiplying the Q-phase current value, the motor rotation-speed detection value and the predetermined motor torque constant together.

2. The controller of claim 1, wherein said motor power-consumption calculation section calculates said motor power consumption by adding a value determined by multiplying the Q-phase current value, the motor rotation-speed detection value and the predetermined motor torque constant together, and a value determined by multiplying a reluctance torque by the motor rotation-speed detection value, the reluctance torque being obtained by multiplying the Q-phase current value, the D-phase current value and a predetermined constant.

3. The controller of claim 1, wherein said motor power-consumption calculation section calculates said motor power consumption by using, as the motor torque constant, an alterable value altering depending on the motor current detection value.

4. The controller of claim 2, wherein said motor power-consumption calculation section calculates said motor power consumption by using, as the motor torque constant, an alterable value altering depending on the motor current detection value.

5. The controller of claim 1, wherein the amplifier drives the electric motor through a PWM control for switching a power device; and wherein said power loss calculation section calculates said amplifier power loss by using, as the amplifier power-loss coefficient, an alterable value altering depending on a switching frequency of the power device.

6. The controller of claim 2, wherein the amplifier drives the electric motor through a PWM control for switching a power device; and wherein said power loss calculation section calculates said amplifier power loss by using, as the amplifier power-loss coefficient, an alterable value altering depending on a switching frequency of the power device.

7. The controller of claim 3, wherein the amplifier drives the electric motor through a PWM control for switching a power device; and wherein said power loss calculation section calculates said amplifier power loss by using, as the amplifier power-loss coefficient, an alterable value altering depending on a switching frequency of the power device.

8. The controller of claim 4, wherein the amplifier drives the electric motor through a PWM control for switching a power device; and wherein said power loss calculation section calculates said amplifier power loss by using, as the amplifier power-loss coefficient, an alterable value altering depending on a switching frequency of the power device.

* * * * *